United States Patent [19]

Mori et al.

[11] 4,354,337
[45] Oct. 19, 1982

[54] APPARATUS FOR PACKAGING ELECTRICAL CIRCUIT COMPONENTS

[75] Inventors: Kazuhiro Mori, Katano; Yasuo Taki, Hirakata; Shigeru Araki, Katano, all of Japan

[73] Assignee: Matsushita Electric Industrial Co., Ltd., Kadoma, Japan

[21] Appl. No.: 125,658

[22] Filed: Feb. 28, 1980

[30] Foreign Application Priority Data

Mar. 5, 1979 [JP] Japan .................................. 54-25807

[51] Int. Cl.³ .............................................. B65B 47/00
[52] U.S. Cl. ........................................ 53/559; 53/558
[58] Field of Search .......................... 53/591, 155-157, 53/539, 246, 553, 238, 240, 170, 289, 558-560; 156/383, 297, 301, 303.1, 250, 552; 47/56

[56] References Cited

U.S. PATENT DOCUMENTS

| | | | |
|---|---|---|---|
| 3,291,136 | 12/1966 | Boyer | 493/325 X |
| 3,421,284 | 1/1969 | Zemek | 53/591 X |
| 3,445,981 | 5/1969 | Hori | 53/553 X |
| 3,608,711 | 9/1971 | Wiesler et al. | 206/330 X |
| 3,655,496 | 4/1972 | Ettre et al. | 206/330 X |
| 3,673,760 | 7/1972 | Canamero et al. | 53/559 X |
| 3,759,011 | 9/1973 | Akke | 53/559 |
| 3,767,349 | 10/1973 | Jezuit | 53/559 X |
| 3,871,945 | 3/1975 | Winrow et al. | 156/303.1 X |
| 4,043,094 | 8/1977 | Bohannon, Jr. | 53/591 X |

Primary Examiner—James F. Coan
Attorney, Agent, or Firm—Cushman, Darby & Cushman

[57] ABSTRACT

An assembly apparatus comprising a driving means for intermittently feeding a carrier tape with recesses formed at a uniform space interval, a plurality of transferring station units for transferring different kinds of electrical chip components from feeders into the recesses, and a control means for controlling assembling order and timings of the transferring operation by the transferring station units.

7 Claims, 12 Drawing Figures

FIG.1 Prior Art
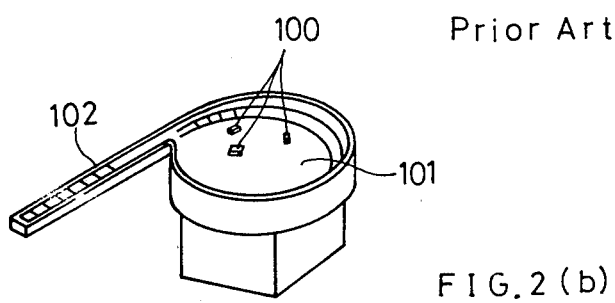
FIG.2(a) Prior Art
FIG.2(b) Prior Art
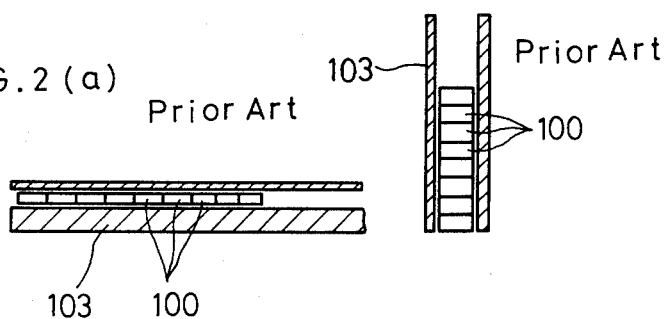
FIG.3 Prior Art
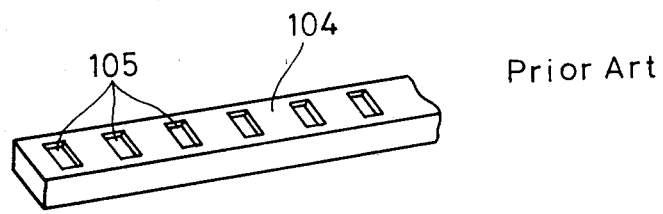

APPARATUS FOR PACKAGING ELECTRICAL CIRCUIT COMPONENTS

BACKGROUND OF THE INVENTION

1. Field of the Invention:

The present invention relates to an apparatus for making electrical circuit components assembly, wherein the electrical components are in a carrying tape for supplying several different wireless electrical components of small sizes (hereinafter referred to as chip components) to a mounting machine for depositing the chip components onto predetermined places on an electrical circuit board.

2. Prior Art:

Conventionally, chip components 100 shown in FIG. 1 such as wireless resistor components and wireless layer-built capacitors are fed to an electrical circuit board (not shown) such as printed circuit boards by means of a known bowl type work-feeder 101 combined with a known in-line type work-feeder 102. The chip components are successively fed in a row by these feeders suitably fixed on a worktable (not shown).

FIGS. 2(a) and 2(b) are cross-sectional views schematically showing portions of another conventional assembly machine of magazine type. FIGS. 2(a) and 2(b) correspond respectively to a feeding process for feeding chip components one by one inside a cylindrical column 103 in a horizontal direction and in a vertical direction.

FIG. 3 is a perspective view showing a part of still another conventional assembly machine of carrier magazine type. FIG. 3 corresponds to the case where a casing 104 is made of e.g. plastics and has encaved recesses 105. The recesses 105 are formed at an equal interval and used for carrying the chip components therein.

The above three conventional methods have the following drawbacks. In the case of FIG. 1, the bowl type and in-line type work-feeders 101 and 102 feed the chip components 100 by vibration, thereby resulting in shortcomings that vibration adversely affects other portions of the assembly machine, that large spaces are necessary for installing several work-feeders at the assembly machine, and further that the chip components 100 are liable to be stuck during feeding through a chute of the in-line type work-feeder 102.

In the case of FIG. 2, the chip components 100 are indexed by a suitable pushing means (not shown). But the magazine method has shortcomings that it takes much time to restore the machine operation when the chip components 100 are stuck, and that the number of the chip components 100 stucked in one column magazine is generally limited.

Further, in the case of FIG. 3, although a stable feeding operation is obtainable, the feeding method by use of the carrier magazines 104 has other shortcomings that a relatively large size is necessary for the carrier magazines 104 in comparison with the small size of the chip components, that large spaces and a complex feeding machine are necessary for automatically feeding the carrier magazines 104, and further that the carrier magazines 104 are necessary to be replaced manually after use.

Because of the drawbacks of the above three conventional feeding methods, when the chip components are mounted on an electrical circuit board, the conventional assembly machine has been difficult to operate due to a complicated structure, and a stable feeding operation is not always obtainable.

On the other hand, U.S. Pat. No. 3,421,284 for A. W. Zemek, assignor to Universal Instruments Corporation discloses a machine for preparing programmed packages of taped electrical components for use in printed circuit board component insertion machines. The machine is adapted to successively deposit groups of programmed components onto a conveyor and to tape the groups of components directly from the conveyor. Another object of the invention there is to provide a dispenser adapted to trim the leads of taped axial lead components and to deposit trimmed components one at a time on an endless conveyor. However, there is a technical need that electrical components without lead wires are reliably assembled in a carrying tape.

The assembly apparatus in accordance with the present invention is used for assembling chip components in predetermined assembling order. There are several differences between the assembly apparatus of the present invention and conventional machines for handling electrical components with wire leads.

Problems supposedly arise from the conventional machines for the following reasons, if they are used for assembling the chip components. (i) Suitably assembled chip components are not available due to difficulties in assembling them. (ii) It is not possible to handle the chip components as like the conventional electrical components with wire leads. (iii) It is further not possible to assemble the chip components by taping them since they have no suitable holding portions like the electrical components with wire leads.

SUMMARY OF THE INVENTION

The present invention provides an apparatus for assembling wireless electrical components, wherein the dissimilar electrical components of small sizes are sequentially assembled for a preprocess in predetermined order to efficiently supply several dissimilar wireless electrical components to a mounting machine for depositing the assembled, or taped chip components onto predetermined places on an electrical circuit board.

The present invention purports to provide an assembly apparatus suitable for assembling dissimilar chip components in a carrier tape in predetermined assembling order. Such a carrier tape with the assembled chip components makes it possible to feed dissimilar chip components to a mounting machine used for depositing the chip components onto an electrical circuit board.

BRIEF DESCRIPTION OF THE DRAWINGS

FIG. 1 is a perspective view showing a conventional bowl type work-feeder combined with a known in-line type work-feeder.

FIGS. 2(a) and 2(b) are cross-sectional views schematically showing portions of another type of conventional assembly machines of magazine type.

FIG. 3 is a perspective view showing a part of still another type of conventional assembly machines of carrier magazine type.

DESCRIPTION OF THE PREFERRED EMBODIMENT

The present invention provides an assembly apparatus comprising a supporting means for supporting a carrier tape which has recesses formed at a uniform space interval, a driving means for intermittently feeding the carrier tape at a speed predetermined responding to the uniform space interval of the recesses on the carrier tape, a plurality of transferring station units for transferring different kinds of electrical chip components into the recesses at stop times of the carrier tape, each transferring unit being for transferring a single kind of the electrical chip components, a control means for controlling assembling order and timings of the transferring operation by the transferring station units, and a binding means for joining a cover tape on the carrier tape after the transferring operation thereby covering openings of the recesses containing the electrical chip components therein.

The assembly apparatus of the present invention makes it possible to solve the abovementioned problems associated with the assembling process of the chip components. The assembly apparatus in accordance with the present invention has distinctive features that the structure thereof is simple and the assembly operation is stable and reliable.

Figure 4:
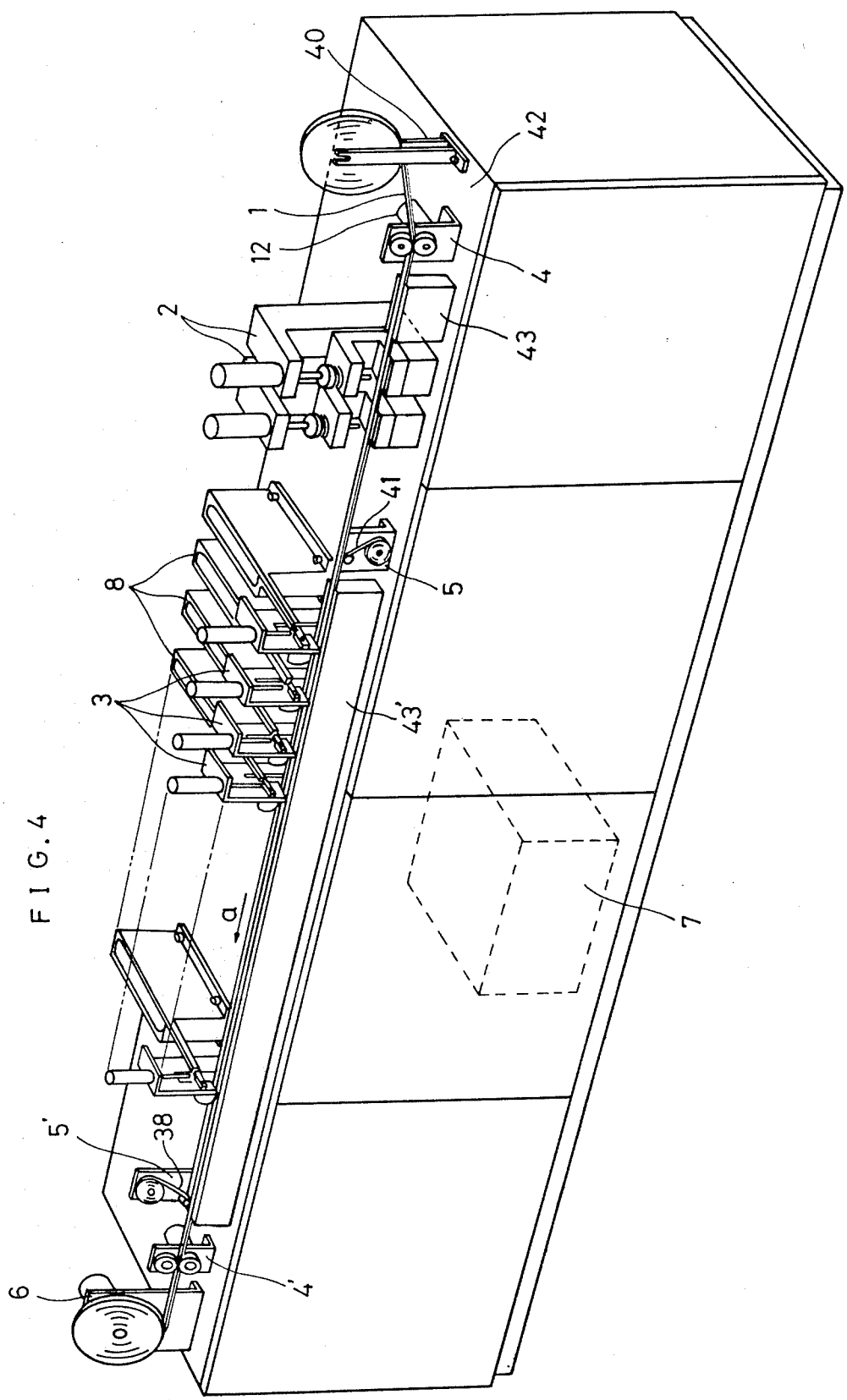
FIG. 4 is a perspective view showing an assembly apparatus embodying the present invention.

FIG. 4 is a perspective view showing an overall structure of an assembly apparatus in accordance with the present invention. A carrier tape 1 supported by a bracket 40 is intermittently fed from a roll thereof in a horizontal direction shown by an feeding means 4 and 4', and the carrier tape 1 is wound up by a tape winding means 6. The carrier tape 1 is punched out by a punching means 2 to form holes for carrying chip components contained therein. Several transferring station units 3 are disposed along the carrier tape 1 in order to transfer the chip components fed from respective feeder means 8 to the punched-out holes in the carrier tape 1. Units 5 and 5' respectively make a lower cover tape 41 and an upper cover tape 38 adhere to the carrier tape 1. An electric control means 7 such as electronics circuits including a small computer is also provided to control the operation of the assembly apparatus of FIG. 4.

Figure 5:
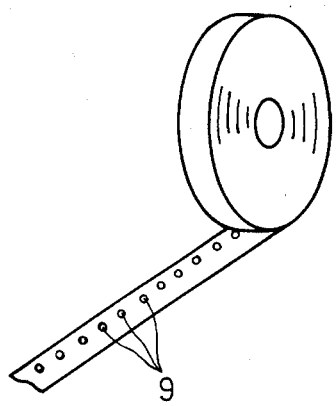
FIG. 5 is a perspective view of a carrier tape employed in the assembly apparatus in accordance with the present invention.

FIG. 5 is a perspective view showing the carrier tape 1 which is used for the assembly apparatus of FIG. 4 and has a number of small holes at a constant interval for feeding by a sprocket means. The carrier tape 1 is preferably elastic and made of e.g. paper.

Figure 6:
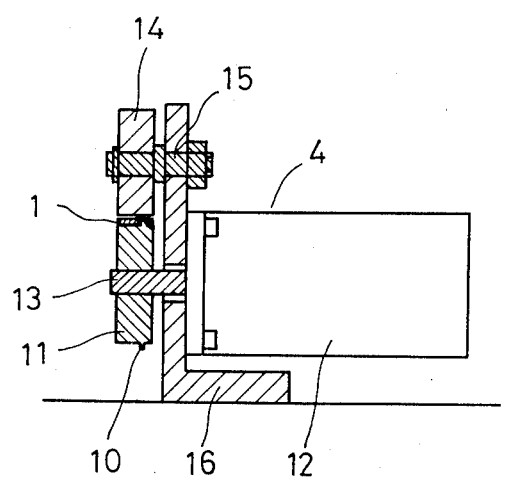
FIGS. 6(a) and 6(b) are a fragmentary sectional side view and a front view of a principal portion of a feeding means to sequentially feed the carrier tape of FIG. 5, respectively.
Figure 6:
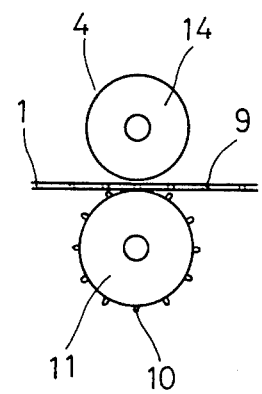

FIGS. 6 (a) and 6(b) are a partially sectional view and a front view of the tape feeding means 4 of the assembly apparatus of FIG. 4. A sprocket 11 having several pins 10 which are to engage with the holes 9 is fixed to a shaft 13 of a driving motor 12. A roller 14 used for pressing the carrier tape 1 is pivotally held on a shaft 15. A bracket 16 supports the driving motor 12 and the shaft 15. The tape feeding means 4' of FIG. 4 has a similar structure to the tape feeding means 4 of FIGS. 6(a) and 6(b). The tape feeding means 4 and 4' are disposed on a worktable 42 to feed the carrier tape 1 on stand holders 43 and 43' without sag.

Figure 7:
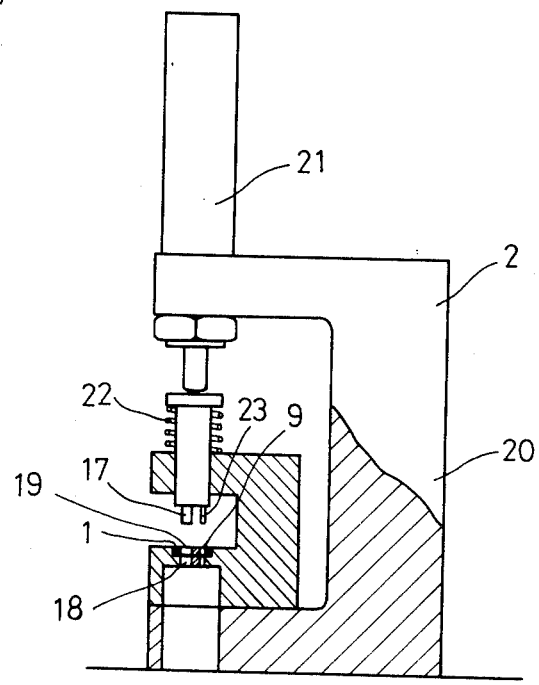
FIG. 7 is a partially cutaway and sectional side view of a station unit for sequentially making punched holes on the carrier tape of FIG. 5.

FIG. 7 is a partially cutaway and cross sectional view showing the punching means 2 of FIG. 4. A punch 17 and a die 18 are used for punching the carrier tape 1 to form holes 19 at predetermined places on the carrier tape 1. The size of the holes 19 is set to be slightly larger than that of the chip components. A cylinder 21 for pressing the punch 17 is fixed to a frame 20. A spring 22 controls the up- and down-motion of the punch 17. A pilot pin 23 adjacent the punch 17 positions the carrier tape 1 by use of the holes 9. In practice, the external form size of the chip components varies much, and therefore a plurality of the punching means 2 are preferably provided along the carrier tape 1 as shown in FIG. 4 so as to punch several different sizes of holes responding to those of the chip components.

Figure 8:
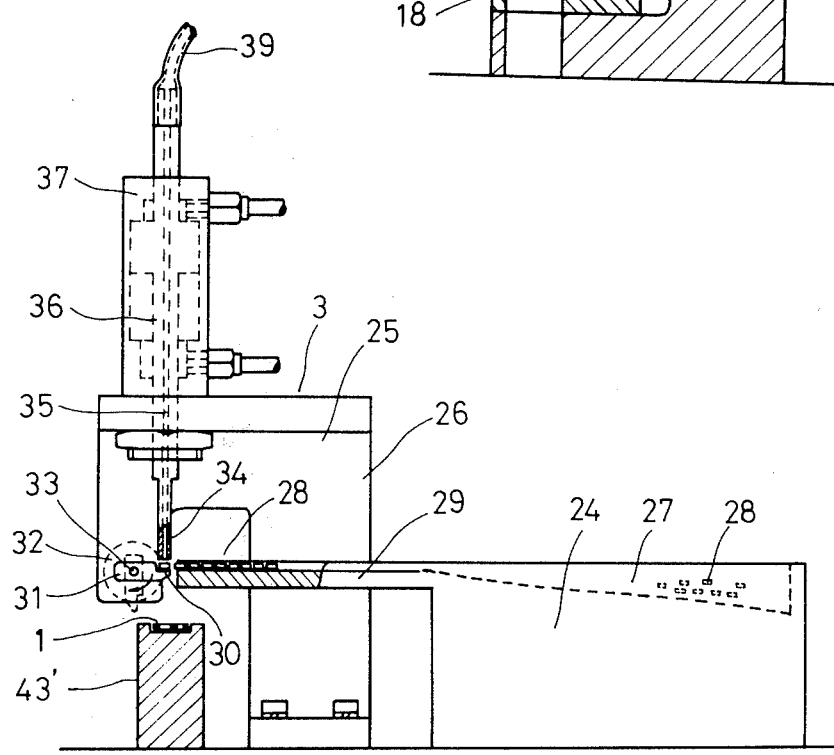
FIG. 8 is a partially sectional side view of a transferring station unit for transferring chip components to the punched holes on the carrier tape of FIG. 5.

FIG. 8 is a partially cross-sectional view showing the transferring station units 3 of FIG. 4. A plurality of transferring units 26 are disposed along the carrier tape 1, in accordance with the number and kinds of the chip components to be transferred. Each transferring unit 26 comprises an in-line feeder 24 and a transferring head 25. The in-line feeder 24 feeds by vibration a number of the chip components 28 in a pot 27 to a chute 29 one by one in line. The transferring head 25 is provided with a receptor 31. The receptor 31 is rotationally supported by a shaft 33 of a rotational cylinder 32. The receptor 31 has a groove 30 and receives one chip component from one tip of the chute 29. The transferring unit 26 further comprises a cylinder 37 with a piston 36. A hole 35 for vacuum-suction is formed in the piston 36, and a suction portion 34 at the lower tip of the piston 36 is positioned so as to fit the position of the groove 30 of the receptor 31. A hose 39 is connected with the upper tip of the piston 36 and is used to suck the air inside the piston 36. The other end of the hose 39 is connected to a vacuum pump (not shown).

Figure 9:
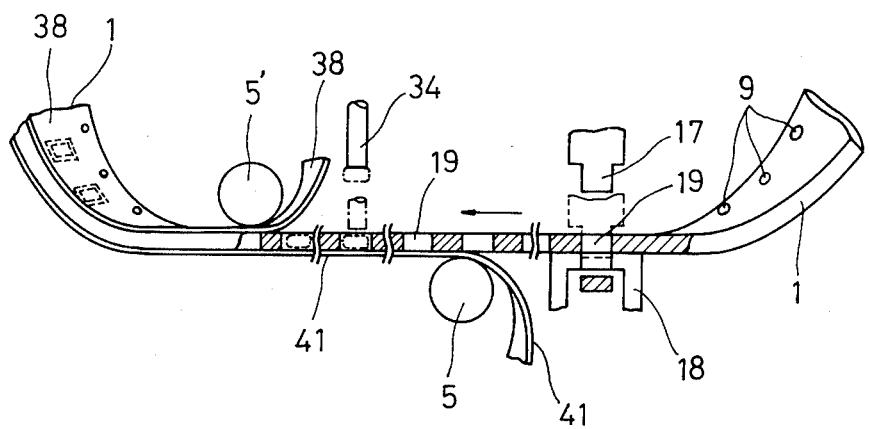
FIG. 9 is a simplified view schematically illustrating processing steps made on the carrier tape of FIG. 5 by the assembly apparatus embodying the present invention.

The operation of the assembly apparatus of the present invention is further elucidated below in detail by referring to FIG. 4 to FIG. 9. FIG. 9 is a view schematically showing the assembly process of the carrier tape 1. The carrier tape 1 wound in a disk form is set at the bracket 40 on the worktable 42. The carrier tape 1 is intermittently fed by the sprocket 11 under the control operation of the feeding means 4 and 4'. When the carrier tape 1 stops in the intermittent motion, the cyliner 21 of the punching means 2 is actuated and punches the carrier tape 1 by means of the punch 17 and the die 18, thereby forming the hole 19 on the carrier tape 1. Then, the unit 5 makes the lower cover tape 41 adhere to the lower side of the carrier tape 1 thereby covering the hole 19 from the bottom side thereof.

At the transferring station units 3, the transferring units 26 are actuated to transfer various kinds of the chip components to the respective holes 19 in pre-programmmed order. The transferring operation of the transferring units 26 is as follows:

The chip component 28 fed to the groove 30 of the receptor 31 is sucked at the suction portion 34 of the piston 36. When the carrier tape 1 stops at a predetermined position, the rotational cylinder 32 is rotated thereby rotating the receptor 31 clockwise, and then the cylinder 36 with the chip component 28 descends and deposits the sucked chip component 28 into the hole 19 of the carrier tape 1. After several kinds of the chip components 28 are assembled in the carrier tape 1 in the programmed assembling order, the unit 5' makes the upper cover tape 38 adhere to the upper side of the carrier tape 1 so as to cover it and to seal the chip components 28 in the holes 19. And finally, the assembled carrier tape 1 is wound by the tape winding means 6.

It is also preferable to employ a thermal pressing method to make the lower and upper cover tapes 41 and 38 adhere to the carrier tape 1, since it is free from adverse effects that the chip components 28 in the holes 19 are liable to adhere to the tapes 41 and 38.

Figure 10:
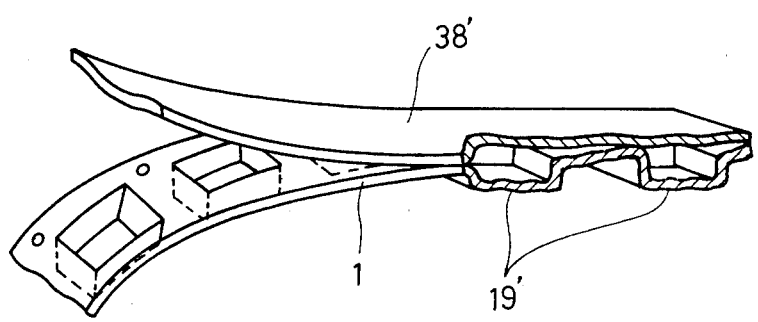
FIG. 10 is a perspective view showing another example of a carrier tape used for assemblying the chip components.

FIG. 10 is a perspective view showing another example of a carrier tape 1. When the carrier tape 1 is made of a resin, recesses 19' with bottoms can be formed by a mold in place of the punch 17. An upper cover tape 38' is used to cover the recesses 19'. In addition, the assembly apparatus in accordance with the present invention may further coomprise a printing means for printing ordering numbers and the number of the chip components on the carrier tape 1. It is also possible to form holes having different sizes in accordance with size variations of the chip components by replacing the punching means 2. Further, it is also necessary for a practical operation to arrange a plurality of the punching means 2 along the carrier tape 1 to punch holes having different sizes adapted to several dissimilar chip components. In this case, it is further necessary to control punching order of the punching means 2 in accordance with the assembling order of the dissimilar chip components.

As so far described, the assembly apparatus in accordance with the present invention makes it possible to assemble several kinds of the chip components in one carrier tape in programmed assembling order. Such an assembled tape is particularly suitable for mounting the chip components on an electrical circuit board, and can be made easily by the operation of the assembly apparatus in accordance with the present invention. The assembly apparatus is therefore versatile in production fields.

What is claimed is:

1. An assembly apparatus for electrical chip components comprising;

means for supporting a carrier tape having recesses therein, with at least upper openings, formed at uniformly spaced intervals along the tape;

means for intermittently feeding the tape a predetermined distance corresponding to said intervals;

a plurality of transferring units spaced along the carrier tape at intervals equal to or a multiple of said recess intervals for transferring an electrical chip component from a supply thereof into a tape recess when said tape is at rest, each of said transferring units being adapted for transferring a single kind of an electrical chip component different from the kind to be transferred by an adjacent transferring unit, each of said transferring units including an in-line feeder for the components, a receptor at a predetermined position near the tape for receiving a component from said feeder, and mechanism disposed above said receptor for picking up the component thereon and depositing the component into a tape recess;

programmed means for controlling the transferring operations of said units; and binding means for joining a cover tape onto said carrier tape after the transferring operations to cover said upper openings of said recesses containing therein electrical chip components.

2. The apparatus defined in claim 1 including means for printing component-identifying indicia onto the tape adjacent each recess therein.

3. The apparatus defined in claim 1 wherein the recesses in the tape are of different size corresponding to different sizes of the components to be received therein.

4. The apparatus defined in claim 3 including a plurality of punching means along the carrier tape in advance of the transferring units as respects the direction of movement of the tape for punching the tape to form the recesses with lower openings; and means for joining a lower tape on the carrier tape to cover said lower openings in advance of said transferring units.

5. The assembly defined in claim 4 wherein the programmed means controls the operation of the punching means.

6. The apparatus defined in claim 3 including a plurality of molding means disposed along the tape in advance of the transferring units, as respects the direction of movement of the tape, for molding the recesses in the tape with closed bottoms.

7. The apparatus defined in claim 6 wherein the programmed means controls the operations of the molding means.

* * * * *